US009023219B2

(12) United States Patent
Deshpande et al.

(10) Patent No.: US 9,023,219 B2
(45) Date of Patent: May 5, 2015

(54) METHOD OF MANUFACTURING A MAGNETORESISTIVE DEVICE

(71) Applicant: Everspin Technologies, Inc., Chandler, AZ (US)

(72) Inventors: Sarin Deshpande, Chandler, AZ (US); Sanjeev Aggarwal, Scottsdale, AZ (US); Kerry Nagel, Phoenix, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 13 days.

(21) Appl. No.: 13/826,658

(22) Filed: Mar. 14, 2013

(65) Prior Publication Data

US 2014/0190933 A1   Jul. 10, 2014

Related U.S. Application Data

(60) Provisional application No. 61/638,957, filed on Apr. 26, 2012.

(51) Int. Cl.
*B44C 1/22* (2006.01)
*G11B 5/127* (2006.01)
*H01L 43/12* (2006.01)

(52) U.S. Cl.
CPC ............... *G11B 5/127* (2013.01); *H01L 43/12* (2013.01)

(58) Field of Classification Search
CPC ..... G11B 5/3116; G11B 5/3163; G11B 5/484

USPC .......... 216/22, 41, 51; 438/3, 689; 29/603.18
See application file for complete search history.

(56) References Cited

U.S. PATENT DOCUMENTS

| 7,105,361 | B2* | 9/2006 | Chen et al. .................... 438/3 |
|---|---|---|---|
| 7,444,740 | B1* | 11/2008 | Chung et al. ............... 29/603.16 |
| 2005/0208682 | A1* | 9/2005 | Nakajima et al. .................. 438/3 |
| 2008/0088986 | A1 | 4/2008 | Horng et al. |
| 2008/0185101 | A1 | 8/2008 | Gaidis et al. |
| 2009/0078927 | A1 | 3/2009 | Xiao et al. |
| 2009/0130779 | A1 | 5/2009 | Li et al. |
| 2009/0173977 | A1 | 7/2009 | Xiao et al. |
| 2010/0032642 | A1* | 2/2010 | Park et al. .......................... 257/4 |
| 2010/0240151 | A1 | 9/2010 | Belen et al. |
| 2010/0304504 | A1* | 12/2010 | Shinde et al. ..................... 438/3 |
| 2010/0308012 | A1* | 12/2010 | Yamamoto ...................... 216/22 |
| 2012/0028373 | A1* | 2/2012 | Belen et al. ....................... 438/3 |

OTHER PUBLICATIONS

International Search Report dated Sep. 13, 2013 for PCT/US2013/038390.

* cited by examiner

*Primary Examiner* — Shamim Ahmed (57) ABSTRACT

A method of manufacturing a magnetoresistive-based device includes a metal hard mask that is inert to a top electrode etch chemistry and that has low sputter yield during a magnetic stack sputter. The metal hard mask is patterned by the photo resist and the photo mask is then stripped and the top electrode (overlying magnetic materials of the magnetoresistive-based device) is patterned by the metal hard mask.

20 Claims, 4 Drawing Sheets

METHOD OF MANUFACTURING A MAGNETORESISTIVE DEVICE

This application claims the benefit of U.S. Provisional Application No. 61/638,957 filed 26 Apr. 2012, which is incorporated herein by reference.

TECHNICAL FIELD

The exemplary embodiments described herein generally relates to methods of manufacturing a magnetoresistive-based device and more particularly to methods of manufacturing a magnetoresistive-based device having an electrically conductive electrode disposed on or over a magnetic material stack.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronic information devices include, but are not limited to, Magnetoresistive Random Access Memory (MRAM), magnetic sensors, and read/write heads for disk drives.

Typically an MRAM includes an array of magnetoresistive memory elements (bits). Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element. In some device designs the free magnetic layer of the MTJ may have stable magnetic states with magnetization in the film plane, and in other cases the stable states have magnetization perpendicular to the plane. In-plane devices typically have their magnetic easy axis defined by the in-plane shape of the free layer and perpendicular devices typically employ materials with a perpendicular magnetic anisotropy (PMA) that create a perpendicular easy axis.

Bit pattern fidelity is extremely important for MRAM performance. An MTJ bit etch comprises a top electrode etch (primarily chemical) and a magnetic stack etch (primarily physical). A hard mask of photoresist and tetra-ethyl-orthosilane (TEOS) does not perform well under these two etches. The bit shape is changed during the top electrode etch and loses its pattern fidelity. This change in bit shape may be reduced by the use of a thick photoresist for high aspect ratio bits, but the thick photoresist has a tendency to collapse causing irregular bit shape.

Accordingly, there is a need for a hard mask and a method of manufacturing a magnetoresistive-based device providing high bit pattern fidelity. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method of manufacturing a magnetoresistive-based device provides high bit pattern fidelity by patterning a hard mask directly with photoresist.

In an exemplary embodiment, a method of manufacturing a magnetoresistive-based device includes providing a magnetic material layer; depositing a metal layer over the magnetic material layer; depositing a patterned photo resist over the metal layer; etching the metal layer not covered by the patterned photo resist to form an electrically conductive electrode; removing the patterned photo resist; and etching the magnetic material layer not covered by the electrically conductive electrode to form a magnetic material stack.

In another exemplary embodiment, a method of manufacturing a magnetoresistive-based device includes providing a magnetic material layer; depositing an electrically conductive layer over the magnetic material; depositing a metal hard mask layer over the electrically conductive layer; depositing a patterned photo resist over the metal hard mask layer; etching the metal hard mask layer not covered by the patterned photo resist to form a metal hard mask; removing the patterned photo resist; etching the electrically conductive layer not covered by the metal hard mask to form an electrically conductive electrode; etching the magnetic material layer not covered by the electrically conductive electrode to form a magnetic material stack; and removing the metal hard mask.

In yet another exemplary embodiment, a method of manufacturing a magnetoresistive-based device includes providing a magnetic material layer; depositing a metal material layer over the magnetic material; depositing a patterned photo resist over the metal material layer; etching the metal material layer not covered by the patterned photo resist to form a electrically conductive electrode; removing the patterned photo resist; and etching the magnetic material layer not covered by the electrically conductive electrode to form a magnetic material stack.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

During the course of this description, like numbers are used to identify like elements according to the different figures that illustrate the various exemplary embodiments.

The exemplary embodiments described herein may be fabricated using known lithographic processes as follows. The fabrication of integrated circuits involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photo resist material is applied onto a layer overlying a wafer substrate. A photo mask (containing clear and opaque areas) is used to selectively expose this photo resist material by a form of radiation, such as ultraviolet light, electrons, or x-rays. Either the photo resist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photo resist as a template.

In one aspect, the present inventions relate to, among other things, methods of manufacturing a magnetoresistive-based device (for example, a magnetoresistive sensor or memory cell) having an electrically conductive electrode disposed on or over a magnetic material stack (for example, one or more layers of magnetic materials). In one embodiment, the methods of manufacturing employ a metal hard mask to form, define and/or pattern the top electrode via etching of one or more layers of electrically conductive materials. Such metal hard mask is relatively inert to or during the etch process of the electrically conductive material(s) during formation, definition and/or patterning of the electrically conductive electrode. For example, in one embodiment, the metal hard mask includes a selectivity in connection with the etch processes (for example, chemical etch and/or mechanical etch processes) of the one or more layers of electrically conductive materials that is greater than or equal to 10:1 and, in a preferred embodiment, includes a selectivity that is greater than or equal to 20:1).

In another embodiment, the metal hard mask is also employed to form, define and/or pattern the magnetic material stack of the magnetoresistive-based device (for example, sensor or memory cell). In this embodiment, the metal hard mask is relatively inert to or during the etch process of one or more layers of magnetic materials that form, define and/or pattern the magnetic material stack. For example, in one embodiment, the metal hard mask includes a selectivity in connection with the chemical etch and/or mechanical etch processes of the one or more layers of magnetic materials that is greater than or equal to 10:1 and, in a preferred embodiment, includes a selectivity that is greater than or equal to 20:1.

In one embodiment, the metal hard mask includes one or more noble metals and/or alloys thereof, for example, alloys of a noble metal with transition metals (for example, Pt, Ir, Mo, W, Ru and/or alloy AB (where A=Pt, Ir, Mo, W, Ru and B=Fe, Ni, Mn). In addition, in one embodiment, the metal hard mask includes a thickness range of about 5-200 Angstroms, and in a preferred embodiment, of about 10-200 Angstroms, and a more preferred embodiment, of about 20-100 Angstroms. For example, the metal mask may be comprised of PtMn or IrMn and include a thickness range of, for example, 15-150 Angstroms or 20-100 Angstroms.

Notably, in another embodiment, the metal hard mask, after formation, definition and/or patterning of the magnetic material stack, may be retained on or over the magnetic material stack and thereafter employed as the electrically conductive electrode (or a portion thereto). That is, after formation, definition and/or patterning of the electrically conductive electrode via etching of one or more layers of electrically conductive materials, the metal hard mask is not removed but employed as the electrically conductive electrode (or portion thereof). In this embodiment, the material of the metal hard mask is sufficiently conductive to function as an electrically conductive electrode as well as sufficiently selective in connection with the etch processes (for example, chemical etch and/or mechanical etch processes) of the one or more the layers of magnetic materials which form or define the magnetic material stack of the magnetoresistive-based device. For example, in one embodiment, the metal hard mask may be PtMn and/or IrMn—which are (i) electrically conductive alloys and (ii) relatively resistant to those certain etch processes of one or more layers of magnetic materials (for example, conventional fluorine and/or chlorine based etch processes) that form, define, and/or provide the magnetic material stack materials of the magnetoresistive-based device.

In yet another aspect, the present inventions relate to a magnetoresistive-based device (for example, sensor or memory cell) and/or an array of magnetoresistive-based devices manufactured using (in whole or in part) any of the techniques described and/or illustrated herein.

Figure 1:
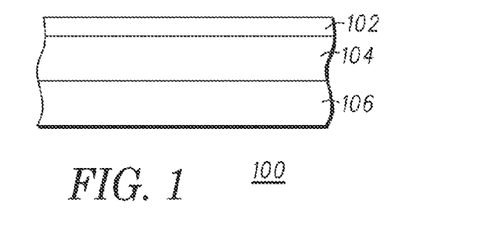
FIGS. 1-7 are cross sectional views of the manufacture of a magnetoresistive-based device in accordance with a first exemplary embodiment.

With reference to one embodiment of FIG. 1 (a cross-sectional view of a partially formed magnetoresistive-based device 100), a metal hard mask layer is deposited, grown, sputtered and/or provided (hereinafter collectively "deposited" or forms thereof) on one or more layers of electrically conductive materials 104 using any technique now known or later developed, for example, well known conventional techniques. In one embodiment, the metal hard mask layer 102 includes and/or consists of a material that is relatively inert to or during the etch process of one or more layers of electrically conductive materials 104 (which, after patterning form the electrically conductive electrode) and one or more layers of magnetic materials 106 (which, after patterning form the magnetic material stack). For example, in one embodiment, the metal hard mask layer 102 includes and/or consists of material having a selectivity in connection with the chemical etch and/or mechanical etch processes of the one or more layers of electrically conductive materials and/or magnetic materials that is greater than or equal to 10:1 and, in a preferred embodiment, includes a selectivity that is greater than or equal to 20:1.

As intimated above, the metal hard mask layer 102 may include and/or consist of one or more noble metals and/or alloy thereof, for example, alloys of a noble metal with transition metals (for example, Pt, Ir, Mo, W, Ru and/or alloy AB (where A=Pt, Ir, Mo, W, Ru and B=Fe, Ni, Mn). Further, in one embodiment, the metal hard mask layer 102 may include a thickness in the range of about 5-200 Angstroms, and in a preferred embodiment, in the range of about 10-150 Angstroms, and more preferred embodiment, in the range of about 20-100 Angstroms. For example, the metal hard mask layer 102 may comprise PtMn or IrMn and include a thickness range of, for example, 15-150 Angstroms or 25-100 Angstroms.

Figure 2:
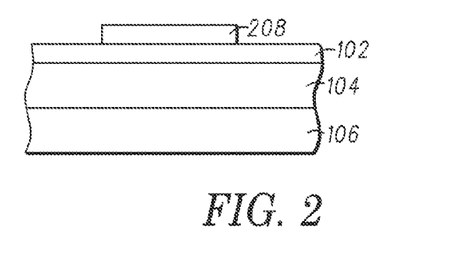

After deposition of the metal hard mask layer 102, a photo resist 208 is deposited thereon and patterned to predetermined dimensions consistent with or correlated to selected dimensions of the electrically conductive electrode to be formed (FIG. 2). The photo resist 208 may be deposited and patterned using any technique now known or later developed, for example, well known conventional deposition and lithographic techniques.

Figure 3:
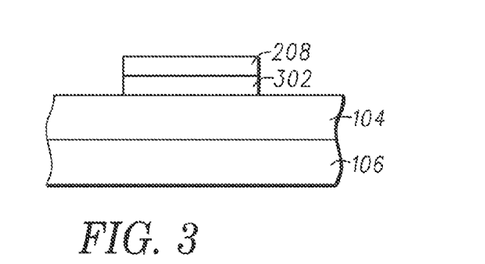

With reference to FIG. 3, the metal hard mask layer 102 is then etched, for example, via mechanical etching (such as, for example, via sputter etching techniques), to form or provide the metal hard mask 302. Notably, the metal hard mask layer 102 may be etched, formed and/or patterned using any etchants and/or technique now known or later developed—for example, using conventional etchants and techniques (for example, optical image end point techniques). It should be noted that the present inventions may employ any suitable materials and techniques, whether now known or later developed, to etch the metal hard mask layer 102 and thereby form, define and/or provide the metal hard mask 302.

Figure 4:
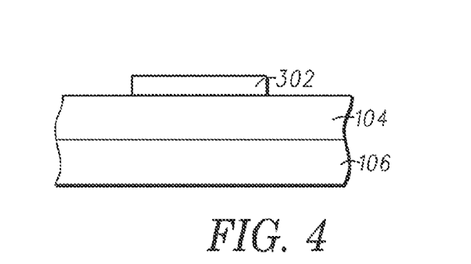

After forming metal hard mask 302 (having a predetermined pattern which is at least partially defined by the patterned photo resist), it may be advantageous to remove or strip the photo resist 208, for example, using conventional techniques (FIG. 4). Here, by removing or stripping the photo resist 208 after the pattern is transferred to the metal hard mask layer 302, there is less likelihood that there will be loss of bit or cell pattern (and, for example, the high aspect ratio) due to a failure of the photo resist 208 (for example, a "collapse" of the photo resist) during subsequent processing.

Figure 5:
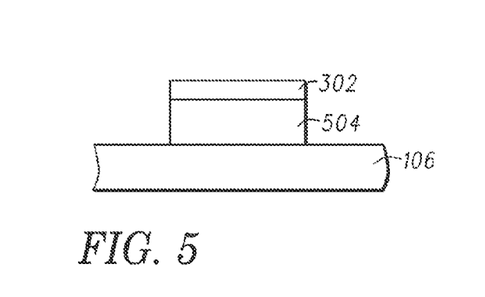

With reference to FIG. 5, the one or more layers of electrically conductive materials 104 are then etched with the metal hard mask 302 "protecting" certain portions thereof, to form, define, pattern and/or provide the electrically conductive electrode 504. The one or more layers of electrically conductive materials 104 (for example, Ta or Ta—TaN composite) may be etched, formed and/or patterned using any etchants and/or technique now known or later developed—for example, using mechanical etchants and techniques (for example, sputter etchants and techniques). It should be noted that the present inventions may employ any suitable etchants and techniques, whether now known or later developed, to etch the one or more layers of electrically conductive materials and thereby form, define and/or provide the electrically conductive electrode 504.

Figure 6:
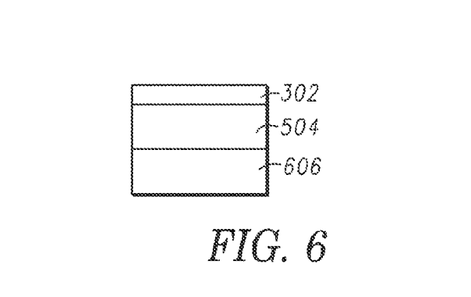

After etching the one or more layers of electrically conductive materials 104 and using the metal hard mask 302 to "protect" the electrically conductive electrode 504, the one or more layers of magnetic materials 106 are etched to form, define, pattern and/or provide the magnetic material stack 606 (FIG. 6). The one or more layers of magnetic materials 106 may be etched, formed, and/or patterned using any etchants and/or technique now known or later developed—for example, using mechanical and/or chemical techniques (for example, a low bias power sputter technique or a chemical etch technique such as a conventional fluorine and/or chlorine based etch technique). Notably, the metal hard mask 302 and electrically conductive electrode 504 are relatively unaffected during formation, definition and/or patterning the magnetic material stack 606. Here, the metal hard mask 302 is relatively inert to such processing and the metal hard mask 302 "protects" the electrically conductive electrode 504 (for example, particularly where such processing employs a mechanical etch technique—such as, low bias power sputter etch technique, due to the metal hard mask's sputter yield at those energies employed in connection with low bias power sputter etch technique.

Figure 7:
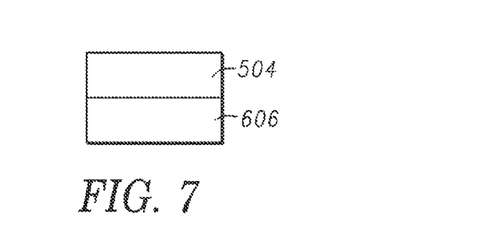

In one embodiment, after formation, definition and/or patterning of the magnetic material stack 606, the metal hard mask 302 may be removed or stripped to facilitate electrical contact to the exposed electrically conductive electrode 504 (FIG. 7). The metal hard mask 302 may be removed or stripped using, for example, conventional techniques. Indeed, after removing or stripping the metal hard mask 302, the exposed electrically conductive electrode 504 may be connected to sense, read and/or write conductors (not shown) and the magnetoresistive-based device completed using any processes and/or structures now known or later developed. Notably, in another embodiment, the metal hard mask 302 is not removed or stripped but the magnetoresistive-based device completed as described immediately above.

As discussed above, in another embodiment, the metal hard mask layer 102, after formation, definition and/or patterning of the metal hard mask 302 therefrom, may serve as both the mask 302 and the electrically conductive electrode 504 (or a portion thereto). For example, with reference to FIG. 8 (a cross-sectional view of a partially formed magnetoresistive-based device 800), in one embodiment, one or more layers of metal materials 804 are deposited on one or more layers of magnetic materials 106. The one or more layers of metal materials 106 include and/or consist of one or more materials that are relatively inert to or during the etch process of one or more layers of magnetic materials (which, after patterning form the magnetic material stack). For example, in one embodiment, the one or more layers of metal materials 804 include and/or consist of materials having a selectivity in connection with the chemical etch and/or mechanical etch processes of the one or more layers of magnetic materials that is greater than or equal to 10:1 and, in a preferred embodiment, includes a selectivity that is greater than or equal to 20:1.

Figure 8:
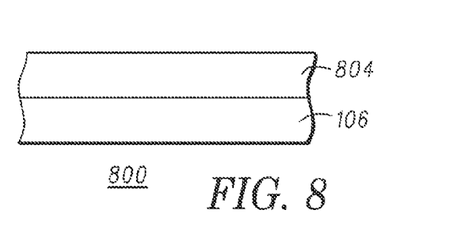
FIGS. 8-12 are cross sectional views of the manufacture of a magnetoresistive-based device in accordance with a second exemplary embodiment.

The one or more layers of metal materials 804 may include and/or consist of one or more noble metals and/or alloy thereof, for example, alloys of a noble metal with transition metals (for example, Pt, Ir, Mo, W, Ru and/or alloy AB (where A=Pt, Ir, Mo, W, Ru and B =Fe, Ni, Mn). Further, in one embodiment, one or more layers of metal materials 804 may include a thickness in the range of about 50-300 Angstroms, and in a preferred embodiment, in the range of about 75-250

Angstroms, and more preferred embodiment, in the range of about 100-200 Angstroms. For example, the one or more layers of metal materials 804 may be comprised of PtMn or IrMn and include a thickness range of, for example, 75-250 Angstroms or 100-200 Angstroms.

Figure 9:
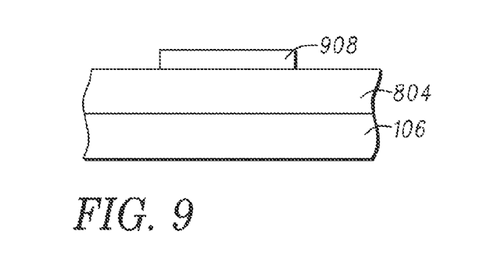
Figure 10:
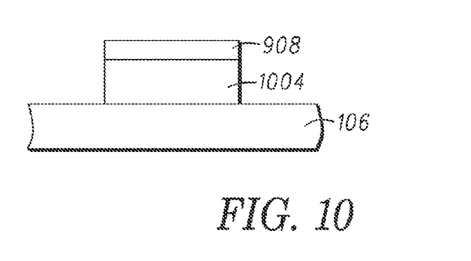

After deposition of the one or more layers of metal materials 804, a photo resist 908 is deposited thereon (FIG. 9) and patterned to predetermined dimensions consistent with or correlated to selected dimensions of the electrically conductive electrode 1004 to be formed (FIG. 10). Similar to the embodiment illustrated in FIGS. 1-7, the photo resist 908 may be deposited and patterned using any technique now known or later developed, for example, well known conventional deposition and lithographic techniques.

With reference to FIG. 10, the one or more layers of metal materials 804 are etched, for example, via mechanical etching (such as, for example, via sputter etching techniques), to form or provide the metal hard mask—electrically conductive electrode 1004. Notably, the one or more layers of metal materials 804 may be etched, formed and/or patterned using any etchants and/or technique now known or later developed—for example, using conventional etchants and techniques (for example, optical image end point techniques). It should be noted that the present inventions may employ any suitable materials and techniques, whether now known or later developed, to etch the one or more layers of metal materials 804 and thereby form, define and/or provide the metal hard mask—electrically conductive electrode 1004.

Figure 11:
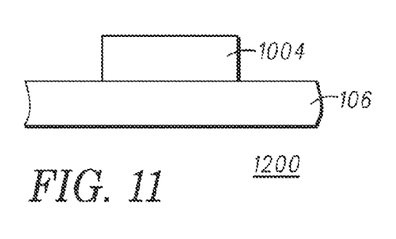

After forming a metal hard mask and electrically conductive electrode 1004 (having a predetermined pattern which is at least partially defined by the patterned photo resist 908), it may be advantageous to remove or strip the photo resist 908, for example, using conventional techniques (FIG. 11). Here, by removing or stripping the photo resist 908 after the pattern is transferred to the metal hard mask layer 804, there is less likelihood that there will be loss of bit or cell pattern (and, for example, the high aspect ratio) due to a failure of the photo resist 908 (for example, a "collapse" of the photo resist) during subsequent processing.

Figure 12:
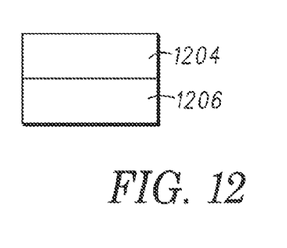

With reference to FIG. 12, using the metal hard mask—electrically conductive electrode 1004 to "protect" the electrically conductive electrode, the one or more layers of magnetic materials 106 are etched to form, define, pattern and/or provide the magnetic material stack 1206. The one or more layers of magnetic materials 106 may be etched, formed and/or patterned using any etchants and/or technique now known or later developed—for example, using mechanical and/or chemical techniques (for example, a low bias power sputter technique or a chemical etch technique such as a conventional fluorine and/or chlorine based etch technique). Notably, the material(s) of the metal hard mask—electrically conductive electrode 1004 are relatively unaffected during formation, definition and/or patterning the magnetic material stack 1206. Here, the metal hard mask—electrically conductive electrode 1004 is relatively inert to such processing and "protects" selected portions of the one or more layers of magnetic materials 106, particularly where such processing employs a mechanical etch technique—such as, low bias power sputter etch technique, due to the metal hard mask's sputter yield at those energies employed in connection with low bias power sputter etch technique.

After formation, definition and/or patterning of the magnetic material stack 1206, the resultant structure is an electrically conductive electrode 1204 disposed on or over the magnetic material stack 1206 (FIG. 12). Thus, in this embodiment, after formation, definition and/or patterning of the magnetic material stack 1206, the metal hard mask—electrically conductive electrode 1004 is not removed or stripped and the exposed portions thereof may be connected to an electrical conductor (sense, read and/or write conductors) and the magnetoresistive-based device completed using any processes and/or structures now known or later developed.

Thus, in this embodiment, the materials of the metal hard mask—electrically conductive electrode 1004 are sufficiently conductive to function as an electrically conductive electrode 1204 as well as sufficiently selective in connection with the etch processes (for example, chemical etch and/or mechanical etch processes) of the one or more the layers of magnetic materials 106 which form or define the magnetic material stack 1206 of the magnetoresistive-based device 1200. For example, in one embodiment, the metal hard mask—electrically conductive electrode 1004 may comprise PtMn and/or IrMn—which are (i) electrically conductive alloys and (ii) relatively resistant to those certain etch processes of one or more layers of magnetic materials (for example, conventional fluorine and/or chlorine based etch processes) that form, define and/or provide the magnetic material stack materials of the magnetoresistive-based device 1200.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects and/or embodiments thereof. For the sake of brevity, many of those permutations and combinations will not be discussed and/or illustrated separately herein.

Figure 13:
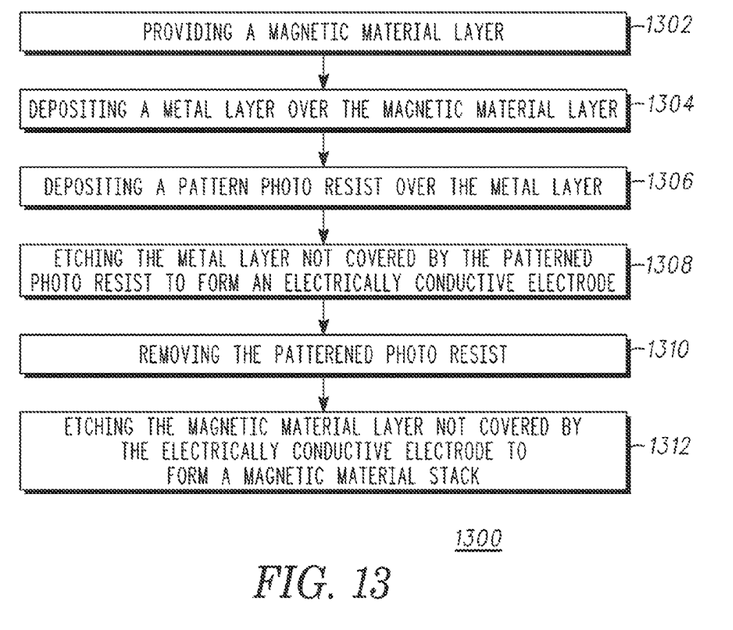
FIG. 13 is a flow chart of a method of manufacturing a magnetoresistive-based device in accordance with the exemplary embodiments.
Figure 14:
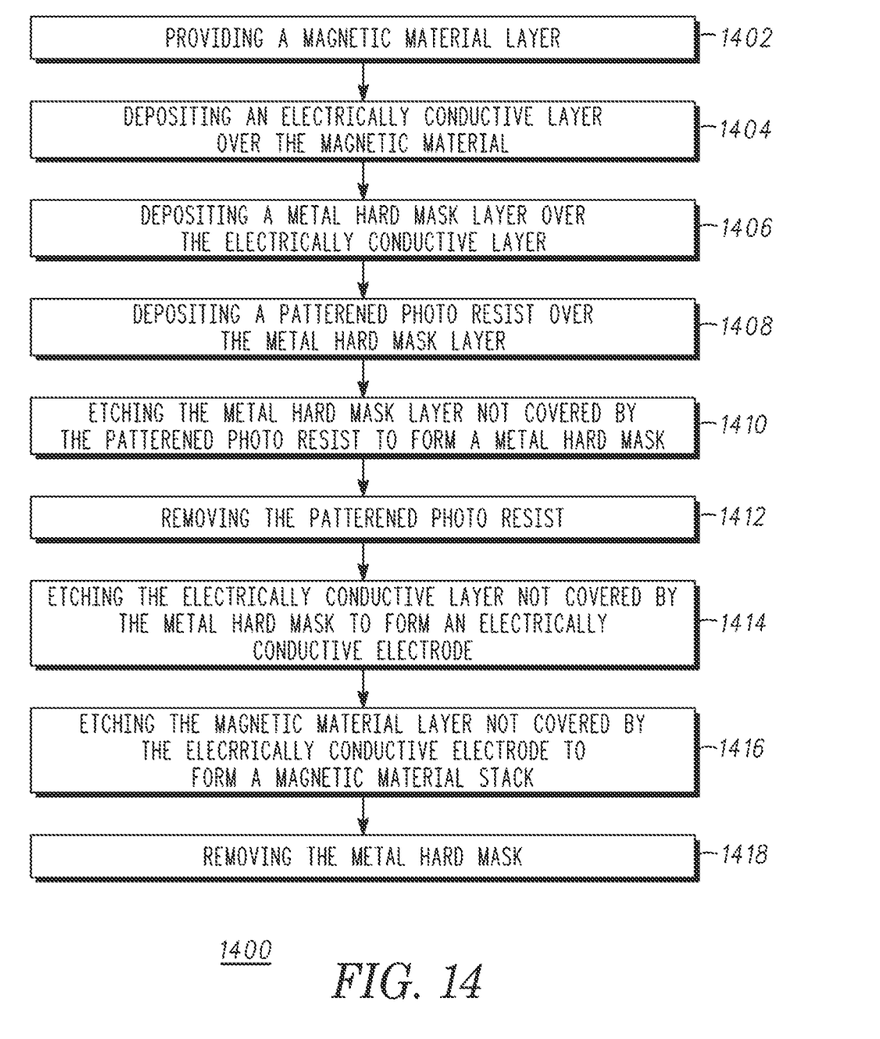
FIG. 14 is a flow chart of a method of manufacturing a magnetoresistive-based device in accordance with the first exemplary embodiment.
Figure 15:
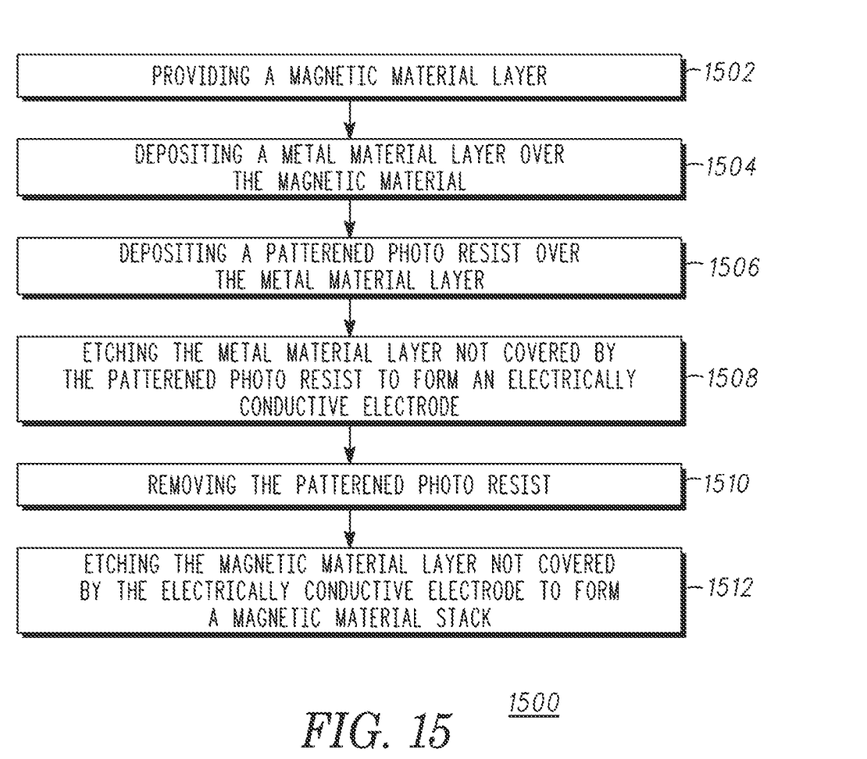
FIG. 15 is a flow chart of a method of manufacturing a magnetoresistive-based device in accordance with the second exemplary embodiment.

FIGS. 13-15 are flow charts that illustrate exemplary embodiments of methods 1300, 1400, 1500 for manufacturing a magnetoresistive-based device. For illustrative purposes, the following description of methods 1300, 1400, 1500 may refer to elements mentioned above in connection with FIGS. 1-12. It should be appreciated that methods 1300, 1400, 1500 may include any number of additional or alternative tasks, the tasks shown in FIGS. 13-15 need not be performed in the illustrated order, and methods 1300, 1400, 1500 may be incorporated into a more comprehensive procedure or process having additional functionality not described in detail herein. Moreover, one or more of the tasks shown in FIGS. 13-15 could be omitted from an embodiment of the methods 1300, 1400, 1500 as long as the intended overall functionality remains intact.

Referring to the flow chart of FIG. 13, a first exemplary embodiment of manufacturing a magnetoresistive-based device includes providing 1302 a magnetic material layer;

depositing 1304 a metal layer over the magnetic material layer; depositing 1306 a patterned photo resist over the metal layer; etching 1308 the metal layer not covered by the patterned photo resist to form an electrically conductive electrode; removing 1310 the patterned photo resist; and etching 1312 the magnetic material layer not covered by the electrically conductive electrode to form a magnetic material stack.

A second exemplary embodiment (FIG. 14) includes providing 1402 a magnetic material layer; depositing 1404 an electrically conductive layer over the magnetic material; depositing 1406 a metal hard mask layer over the electrically conductive layer; depositing 1408 a patterned photo resist over the metal hard mask layer; etching 1410 the metal hard mask layer not covered by the patterned photo resist to form a metal hard mask; removing 1412 the patterned photo resist; etching 1414 the electrically conductive layer not covered by the metal hard mask to form an electrically conductive electrode; etching 1416 the magnetic material layer not covered by the electrically conductive electrode to form a magnetic material stack; and, while it is preferred the metal hard mask remain, it may optionally be removed.

A third exemplary embodiment (FIG. 15) includes providing 1502 a magnetic material layer; depositing 1504 a metal material layer over the magnetic material; depositing 1506 a patterned photo resist over the metal material layer; etching 1508 the metal material layer not covered by the patterned photo resist to form an electrically conductive electrode; removing 1510 the patterned photo resist; and etching 1512 the magnetic material layer not covered by the electrically conductive electrode to form a magnetic material stack.

The bit shape of the exemplary embodiments is retained from the photoresist patterning through etch by the use of a thin metal hard mask, allowing for a thinner photoresist and thereby improving the required resist aspect ratio for a high aspect ratio top electrode height to critical dimension (CD) ratios. Pattern collapse during photoresist or during etch caused by a large photoresist thickness is eliminated, thereby improving on photo fidelity.

Although the described exemplary embodiments disclosed herein are directed to various memory or sensor structures and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of manufacturing a magnetoresistive-based device, comprising:
   providing a magnetic material layer;
   depositing a first metal layer over the magnetic material layer;
   depositing a second metal layer over the first metal layer;
   providing a patterned photo resist over the second metal layer;
   etching the second metal layer not covered by the patterned photo resist to form a patterned metal hard mask;
   etching the first metal layer not covered by the patterned metal hard mask to form an electrically conductive electrode;
   etching the magnetic material layer not covered by the electrically conductive electrode to form a magnetic material stack; and
   removing the patterned metal hard mask to expose the electrically conductive electrode.

2. The method of claim 1 wherein depositing second metal layer comprises:
   depositing a material that is inert to the etching of the electrically conductive electrode.

3. The method of claim 1 wherein removing the patterned metal hard mask comprises:
   removing the patterned metal hard mask after etching the magnetic material layer.

4. The method of claim 1 wherein depositing the second metal layer comprises:
   depositing one or more noble metals, or one or more noble metals and alloys thereof to form the second metal layer.

5. The method of claim 1 wherein providing the magnetic material layer comprises:
   depositing a plurality of layers of magnetic materials.

6. The method of claim 1 wherein depositing the first metal layer comprises:
   depositing at least one of Ta and Ta—TaN.

7. The method of claim 6 wherein depositing the second metal layer comprises:
   depositing one or more metals comprising at least one of the elements selected from the group consisting of Pt, Ir, Mo, W, Ru and alloy AB, where A comprises Pt, Ir, Mo, W, Ru and B comprises Fe, Ni, Mn.

8. A method of manufacturing a magnetoresistive-based device, comprising:
   providing a magnetic material layer;
   depositing an electrically conductive layer over the magnetic material;

depositing a metal hard mask layer over the electrically conductive layer;

providing a patterned photo resist over the metal hard mask layer;

etching the metal hard mask layer not covered by the patterned photo resist to form a metal hard mask;

etching the electrically conductive layer not covered by the metal hard mask to form an electrically conductive electrode;

etching the magnetic material layer not covered by the electrically conductive electrode and the metal hard mask to form a magnetic material stack; and removing the metal hard mask to expose the electrically conductive electrode.

9. The method of claim 8 wherein the depositing the metal hard mask layer comprises:

depositing a material that is inert to the etching of the electrically conductive layer.

10. The method of claim 8 wherein the depositing the metal hard mask layer comprises:

depositing a material having a selectivity during the etching of the electrically conductive layer that is greater than 10:1 relative to the electrically conductive layer.

11. The method of claim 8 wherein depositing the metal hard mask layer comprises:

depositing one or more noble metals, or one or more noble metals and alloys thereof.

12. The method of claim 8 wherein providing the magnetic material layer comprises:

depositing a plurality of layers of magnetic materials.

13. The method of claim 8 wherein:

depositing the metal hard mask comprises depositing one or more metals comprising at least one of the elements selected from the group consisting of Pt, Ir, Mo, W, Ru and alloy AB, where A comprises Pt, Ir, Mo, W, Ru, and B comprises Fe, Ni, Mn, depositing the electrically conductive layer comprises depositing at least one of Ta and Ta—TaN.

14. The method of claim 8 wherein removing the metal hard mask comprises stripping the metal hard mask.

15. A method of manufacturing a magnetoresistive-based device, comprising:

providing a magnetic material layer;

depositing a first metal material layer over the magnetic material layer;

depositing a metal hard mask layer over the first metal material layer, wherein the metal hard mask layer consists of a different material from the first metal material layer;

depositing a photo resist over the metal hard mask layer;

patterning the photo resist to provide a patterned photo resist;

etching the metal hard mask layer not covered by the patterned photo resist to form a metal hard mask;

etching the first metal material layer not covered by the metal hard mask to form an electrically conductive electrode;

removing the patterned photo resist;

etching the magnetic material layer not covered by the electrically conductive electrode to form a magnetic material stack; and removing the metal hard mask.

16. The method of claim 15 wherein the providing the magnetic material layer comprises:

depositing a plurality of layers of magnetic materials.

17. The method of claim 16 wherein the removing the metal hard mask comprises:

removing the metal hard mask after etching the magnetic material layer.

18. The method of claim 15 wherein depositing the metal hard mask layer comprises depositing one or more noble metals, or one or more noble metals and alloys thereof; and depositing the first metal material layer comprises depositing at least one of Ta and Ta—TaN.

19. The method of claim 15 wherein depositing the first metal material layer comprises:

depositing the first metal material layer comprises depositing at least one of Ta and Ta—TaN.

20. The method of claim 19 wherein depositing the metal hard mask layer comprises:

depositing at least one of PtMn and IrMn.

* * * * *